United States Patent [19]

Rostoker

[11] Patent Number: 5,675,142

[45] Date of Patent: *Oct. 7, 1997

[54] PHOTOSENSOR ARRAY WITH BINARY LENS ELEMENTS

[75] Inventor: Michael D. Rostoker, San Jose, Calif.

[73] Assignee: LSI Logic Corporation, Milpitas, Calif.

[*] Notice: The term of this patent shall not extend beyond the expiration date of Pat. No. 5,519,205.

[21] Appl. No.: 521,208

[22] Filed: Aug. 30, 1995

Related U.S. Application Data

[62] Division of Ser. No. 291,776, Oct. 21, 1994, Pat. No. 5,529,936, which is a continuation of Ser. No. 954,856, Sep. 30, 1992, abandoned.

[51] Int. Cl.$^6$ .................................................. H01J 40/14
[52] U.S. Cl. ...................... 250/208.1; 250/216; 250/226; 359/565
[58] Field of Search .................... 250/208.1, 216, 250/226, 578.1; 257/432, 436, 294; 359/482, 483, 563, 565

[56] References Cited

U.S. PATENT DOCUMENTS 5,519,205  5/1996  Rostoker ........................... 250/208.1

*Primary Examiner*—Stephone Allen
*Attorney, Agent, or Firm*—Oppenheimer Poms Smith

[57] ABSTRACT

Methods of etching optical elements in association with photosensitive elements are described. In some of the arrangements, the optical elements are formed integrally with a substrate containing the photosensitive elements. In other arrangements, an optical element is mounted to a package, or the like, containing the substrate and photosensitive elements. In other arrangements, two or more optical elements are employed, including conventional refractive elements, refractive focusing elements, and refractive beam splitting elements. Utility as solid state image sensors is discussed. Utility for monochromatic and color imaging is discussed.

20 Claims, 6 Drawing Sheets

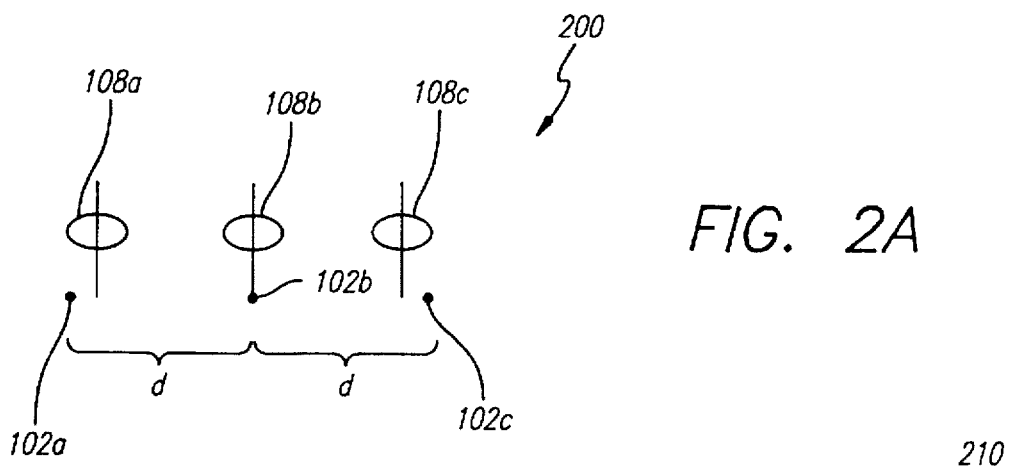
FIG. 2A
FIG. 2B
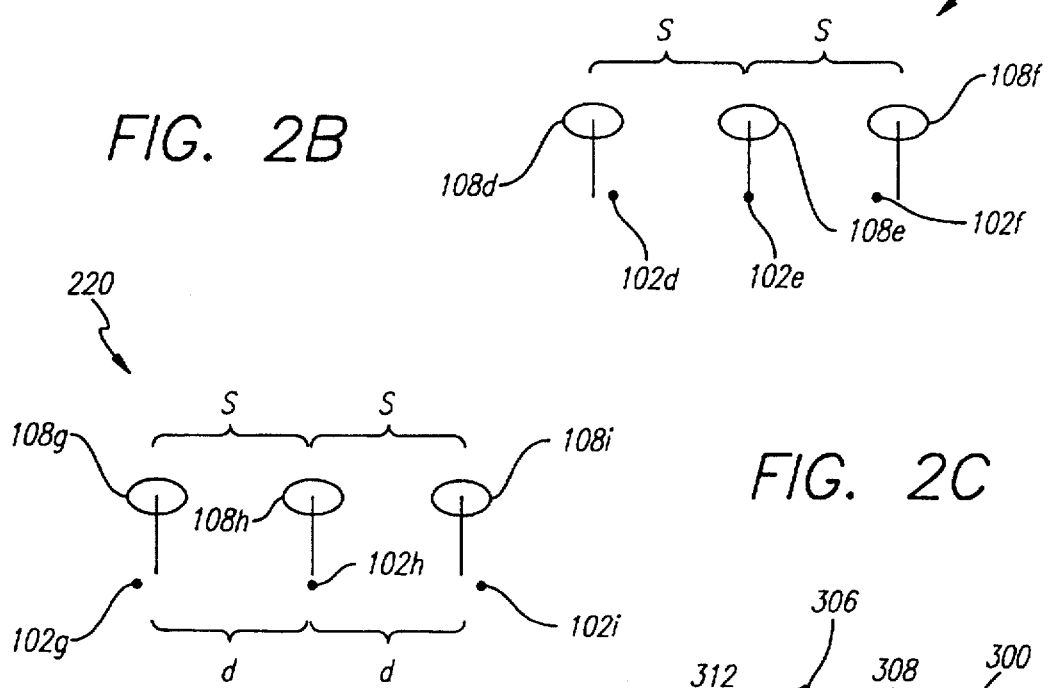
FIG. 2C
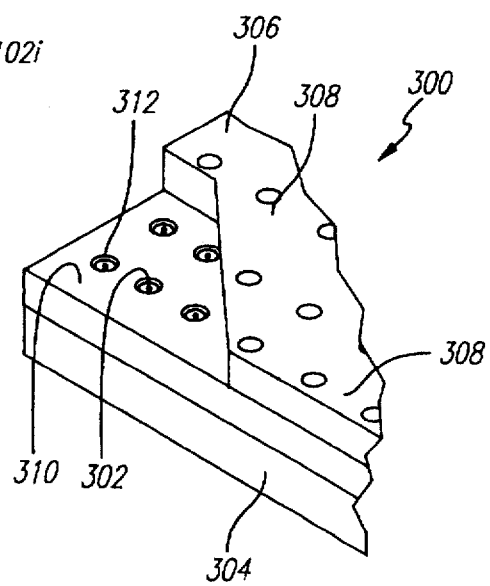
FIG. 3

PHOTOSENSOR ARRAY WITH BINARY LENS ELEMENTS

This application is a division of U.S. patent application Ser. No. 08/291,776, entitled METHOD OF ETCHING A LENS FOR A SEMICONDUCTOR SOLID STATE IMAGE SENSOR, filed Oct. 21, 1994 now U.S. Pat. No. 5,529,936, which is a continuation of Ser. No. 07/954,856, filed Sep. 30, 1992, now abandoned, by Michael D. Rostoker.

TECHNICAL FIELD OF THE INVENTION

The invention relates to imaging onto a photo-sensitive semiconductor device.

BACKGROUND OF THE INVENTION

Modern charge-coupled devices and other photosensitive semiconductor devices (hereinafter "solid state image sensors") are capable of providing signals representing images formed (focused) on a surface thereof. Generally, the surface of a solid state image sensor is provided with an array (for example, rows and columns) of discrete photosensitive semiconductor elements (for example gates or junctions), and particular array locations correspond to a particular "pixel" (or position) in the image. Modern video cameras, for example, use discrete lens systems (optics) to focus images onto such solid state image sensors.

Generally, a single "taking" lens is supported at a fixed distance, such as at least several or tens of millimeters, from the array of photosensitive elements, so that an image may be focused onto the array. The array is located at the focal plane of the lens. Additional lenses, in front of the taking lens, provide for focusing and image enlargement.

Binary (diffractive) optical elements are discussed in "Binary Optics", *Scientific American*, May, 1992, pages 92, 94–97 ("Article"), incorporated by reference herein.

U.S. Pat. No. 4,425,501 discloses a transparent member 20 upon which a plurality of lenslets have been formed. The member is "mounted above" the die 10. Each lenslet is associated with a pair of detectors on the die.

U.S. Pat. No. 4,553,035 discloses in FIG. 3A two one-dimensional arrays 21 of photodetectors juxtaposed to a cylindrical lens 21. Also, as shown in FIG. 14, three rows of one-dimensional sensors may be provided, and red (R), green (G) and blue (B) filters may be installed, whereby signals of each sensor may be independently read to obtain color information.

U.S. Pat. No 4,636,631 discloses a lens 8 assembled to a wafer 2 on a substrate 1, with thickness-calibrating shims 6,7 and with a layer of photoresist 5.

U.S. Pat. No. 4,733,096 discloses in FIG. 2 a lens structure ("sensor substrate" 32; 32a, 32b, 38). An insulating layer 42 is juxtaposed with the lens structure 32. Sensors 44 are juxtaposed with the insulating layer 42.

Reference is made to U.S. Pat. Nos. 4,851,862 and 4,899,174.

DISCLOSURE OF THE INVENTION

It is an object of the present invention to provide an improved solid state image sensor.

It is a further object of the invention to provide a method of making such an image sensor.

It is a further object of the present invention to provide a solid state image sensor with integral optics.

It is a further object to provide solid state image sensors useful for color imaging.

It is a further object to provide a method of imaging using a solid state image sensor.

It is a further object of the present invention to provide an imaging apparatus. In a preferred embodiment, the apparatus comprises a camera. Preferably, the camera includes the solid state image sensor discussed above.

According to a preferred embodiment of the invention, an optically-transmissive layer is integrally formed over a substrate having an array of photosensitive elements on its surface. The layer is provided with an array of lenslets, preferably binary optics. There is a one-to-one correspondence between the lenslets and the photosensitive elements. The lenslets are physically or virtually offset from the photosensitive elements, so that each photosensitive element provides a unique pixel of information corresponding to a unique position of an incident image. In aggregate, the photosensitive elements provide a complete two-dimensional representation of the incident image.

Further according to the invention, the photosensitive elements can be arranged in regular, irregular, square or rectangular arrays.

Further according to the invention, the array of photosensitive elements may cover substantially the entire underlying substrate, or may cover only a selected area (e.g., a central area) of the substrate.

Further according to the invention, an opaque masking layer can be interposed between the lenslet layer and the photosensitive elements, and the masking layer can be provided with holes aligned with the photosensitive elements. In this manner, light focused by a lenslet that is not incident on a photosensitive element is prevented from impacting circuit elements which may be disposed on the substrate between the photosensitive elements.

Further according to the invention, an optically-transmissive layer may be interposed between the lenslet-containing layer and the photosensitive elements. This layer acts as an integral standoff between the substrate and the lenslet-containing layer.

Further according to the invention, both an optically-transmissive and a masking layer can be interposed between the lenslet-containing layer and the surface of the substrate. The optically-transmissive layer may be disposed over the masking layer, or vice-versa.

Further according to the invention, various materials and techniques are described for the lenslet-containing layer, the masking layer and the optically-transmissive (interposed) layer.

Further according to the invention, the lenslets are preferably formed as diffractive (rather than as refractive) optical devices.

In an alternate embodiment of the invention, a focusing element is supported by a package body, or the like, above the surface of a substrate.

Further according to the invention, a first optical element is supported by a package body, or the like, above the surface of a substrate, and a second optical element is integrally formed on the substrate. These two optical elements may cooperate to minimize spherical and/or chromatic aberrations exhibited by either of the optical elements.

Further according to the invention, photosensitive elements are arranged in closely spaced "triads" (or "triplets"), and the triads are arranged in an array. An overlying optically-transmissive layer has lenslets formed therein. One lenslet is associated with each triad of photosensitive elements. The lenslet is preferably a diffractive device that is capable of focusing different wavelengths (e.g., red, green, blue) of incident light onto a particular one of the three photosensitive elements of a triad.

Further according to the invention, three monochromatic image sensors are juxtaposed in a linear array, a curved array, or a triangular pattern. An additional optical element serves as a beam splitter, and directs different wavelengths of incident light onto a particular one of the three monochromatic image sensors.

Other objects, features and advantages of the invention will become apparent in light of the following description thereof.

BRIEF DESCRIPTION OF THE DRAWINGS

FIG. 2A is a diagrammatic representation of a physical offset between lenslets and photosensitive elements, according to the present invention.

FIG. 2B is a diagrammatic representation of an alternate embodiment of a physical offset between lenslets and photosensitive elements, according to the present invention.

FIG. 2C is a diagrammatic representation of an embodiment of a virtual (rather than physical) between lenslets and photosensitive elements, according to the present invention.

FIG. 3 is a partially cut-away, perspective view of an alternate embodiment of the invention.

DETAILED DESCRIPTION OF THE INVENTION

Figure 1:
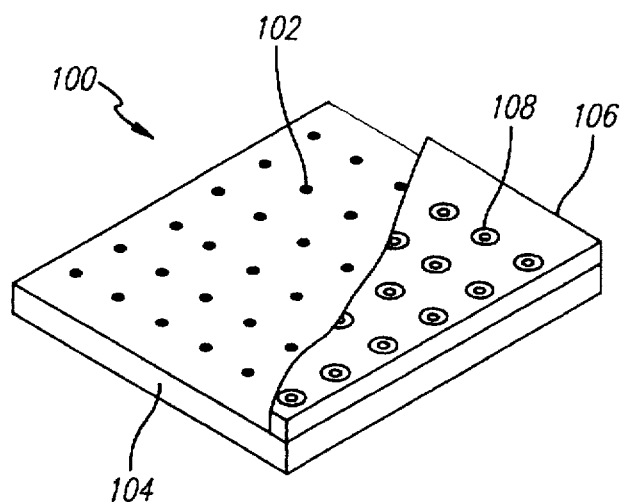
FIG. 1 is a partially cut-away, perspective view of the basic solid state image sensor, according to the present invention.
Figure 1A:
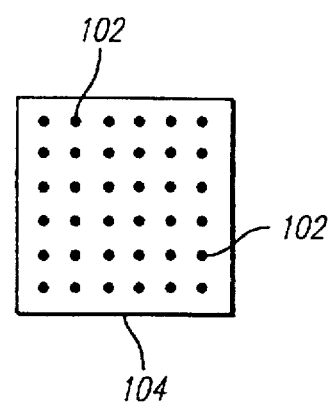
FIG. 1A is a plan view of the surface of a substrate having an array of photosensitive elements, according to the present invention.
Figure 1B:
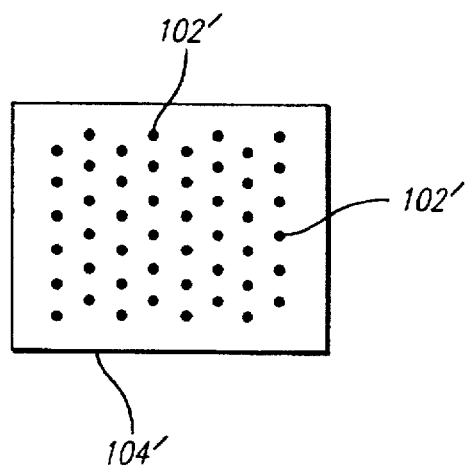
FIG. 1B is a plan view of an alternate embodiment of the surface of a substrate having an array of photosensitive elements, according to the present invention.

FIG. 1 show a solid state image sensor 100. A plurality of photosensitive elements 102 (shown as dots "•") are formed on the front surface (up, in the figure) of a substrate 104. The photosensitive elements 102 may be memory cells, which discharge upon incidence of light, or any other suitable device which changes state or generates a potential or potential difference upon incidence of light. The substrate 104 may be a silicon semiconductor die. Other suitable semiconducting materials may also be used. The photosensitive elements 102 are arranged in an array or hundreds or thousands of rows and columns (only six rows and columns shown, for clarity). Preferably, the photosensitive elements are arranged in a square (m×m) or rectangular (m×n) array of evenly spaced elements. However, the photosensitive elements of one row (or column) can be offset from the elements of an adjacent row (or column). In FIG. 1A, the photosensitive elements 102 are arranged in a square array, and are arranged in columns and rows. In FIG. 1B, the photosensitive elements 102' are arranged in a rectangular array on the surface of a substrate 104', and the photosensitive elements 102' of one row (or column) are offset from the photosensitive elements 102' of adjacent rows (or columns).

Figure 1C:
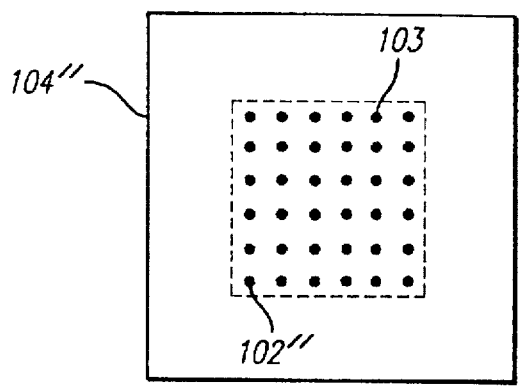
FIG. 1C is a plan view of an yet another embodiment of the surface of a substrate having an array of photosensitive elements, according to the present invention.

Returning to FIG. 1, an optically-transmissive layer 106 is applied over the substrate, covering at least the entire array of elements 102 (or 102', or 102" discussed hereinbelow). Although the elements 102 are shown covering substantially the entire surface of the substrate, it is within the scope of this invention that the array of elements occupies only a selected area, such as a central area 103 (dashed lines), of the substrate 104", as shown in FIG. 1C, where the photosensitive elements 102" cover only a central area 103 of the substrate 104".

In FIG. 1A, the photosensitive elements of one row are aligned with the photosensitive elements of an adjacent row, and the photosensitive elements of one column are aligned with the photosensitive elements of an adjacent column.

In FIG. 1B, the photosensitive elements of one row are offset from (located orthogonally between) the photosensitive elements of an adjacent row, and the photosensitive elements of one column are offset from the photosensitive elements of an adjacent column.

Returning to FIG. 1, the layer 106 is formed of a suitably optically-transmissive material, such as silicon dioxide (Sio₂), spin-on glass, re-flow glass, photoresist, spin-on photoresist, reflow photoresist, or the like, and is preferably of substantially uniform thickness. Spin-on and re-flow techniques provide relatively uniform thickness layers. In the event that the thickness of the layer 106 is non-uniform, as initially applied, it is preferably planarized by chemical-mechanical polishing techniques, or the like. For a description of chemical-mechanical polishing techniques, see (e.g.) U.S. Pat. Nos. 4,671,851, 4,910,155 and 4,944,836, incorporated by reference herein.

Alternatively, the layer 106 can be applied as a sedimentary layer of relatively uniform thickness, as discussed in commonly-owned, copending U.S. patent application Ser. No. 906,902, entitled SEDIMENTARY DEPOSITION OF PHOTORESIST ON SEMICONDUCTOR WAFERS, filed Jun. 29, 1992 by Rostoker.

The thickness of the layer can be verified by optical interference techniques, or the like, and adjusted to an appropriate final thickness.

As shown in FIG. 1, the layer 106 is provided with a plurality of lens elements, or "lenslets" 108 (shown as circles "o"). The lens elements 108 are arranged in an array or hundreds or thousands of rows and columns (only six rows and columns shown, for clarity), corresponding on a one-to-one basis to the underlying elements 102. The lenslets (lens elements) 108 are aligned over the photosensitive elements 102 in one of various ways discussed hereinbelow. Preferably, the lens elements 108 are formed as diffractive (binary) optical structures capable of focusing an image onto the underlying photosensitive elements 102.

Although each lenslet 108 is generally directly over a corresponding photosensitive element 102, each pair of lenslets and corresponding photosensitive element is specifically arranged to sense a particular portion of an image being focused onto the substrate. This is accomplished in one of a variety of ways.

FIG. 2A shows an arrangement 200 of three lens elements 108a, 108b and 108c, over three corresponding photosensitive elements 102a, 102b and 102c. In this example, the photosensitive elements are arranged in a regular array, with constant spacing "d" therebetween. (This figure illustrates only three photosensitive elements and lens element.) However, the lens elements are arranged in an irregular array, with varying spacing. More particularly, the lens element 108a is physically offset in one or two dimensions from the photosensitive element 102a. The lens element 108b is physically aligned with (directly over) the photosensitive element 102b. The lens element 108c is physically offset in an opposite (from the offset of 108a) direction from the photosensitive element 102c. In this manner, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. In aggregate, the plurality of photosensitive elements will provide pixel information for the entire image of interest—each pixel representing a particular location on the image. The various physical offsets of the lens elements are arranged to effect this result, namely by covering the entire two dimensional field of the image.

FIG. 2B shows an alternate arrangement 210 of three lens elements 108d, 108e and 108f, over three corresponding photosensitive elements 102d, 102e and 102f. In this example, the lens elements are arranged in a regular (evenly spaced) array, with constant spacing "s" therebetween. However, the photosensitive elements are arranged in an irregular (varying spacing) array. More particularly, the photosensitive element 102d is physically offset in one or two dimensions from the lens element 108d. The photosensitive element 102e is physically aligned with (directly under) the lens element 108e. The photosensitive element 102f is physically offset in an opposite (from the offset of 102e) direction from the lens element 108f. In this manner, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. Again, in aggregate, the plurality of photosensitive elements will provide pixel information for the entire image of interest— each pixel representing a particular location on the image. The various offsets of the photosensitive elements are arranged to effect this result, namely by covering the entire two dimensions of the image.

FIG. 2C shows an alternate arrangement 220 of three lens elements 108g, 108h and 108i, over three corresponding photosensitive elements 102g, 102h and 102i. In this example, the lens elements are arranged in a regular array, with constant spacing "s" therebetween, and the photosensitive elements are arranged in a regular array with constant spacing "d" therebetween. In other words, the lenslets are all physically aligned with the underlying photosensitive elements, with no physical offset. In the event that all of the lenslets 108g, 108h and 108i were formed the same (same focusing parameters) as one another, this would result in all of the photosensitive elements 102g, 102h and 102i providing the same pixel information as the remaining photosensitive elements. Therefore, the lens elements 108g, 108h and 108i are each formed as binary (diffractive) optics, with unique focusing characteristics. More particularly, the lenslet 108g is formed with its focal point offset in one or two dimensions from the photosensitive element 102g. The lenslet 108h is formed with its focal point aligned with the photosensitive element 102h. The lenslet 108i is formed with its focal point offset in an opposite direction (vis-a-vis the lenslet 108g) from the photosensitive element 102e is physically aligned with the lens element 102i. This provides a "virtual" offset for each pair of lenslets and photosensitive elements, in marked contrast to the "physical" offsets described with respect to FIGS. 2A and 2B. However, the result is similar in that, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. Again, in aggregate, the plurality of photosensitive elements will provide pixel information for the entire image of interest—each pixel representing a particular location on the image. The various virtual offsets are arranged to effect this result, namely by covering the entire two dimensions of the image.

The commonality between the arrangements of FIGS. 2A, 2B and 2C is that the relative orientation (whether physical or virtual) of the lenslets and photosensitive elements is arranged so that light from a selected portion of an image being focused by the lenslets onto the substrate is focused onto only one of the photosensitive elements, and in aggregate the photosensitive elements of the array provide a complete pixel-by-pixel image (i.e., signals representative of the incident image).

In the arrangements 200, 210 or 220 of FIGS. 2A, 2B or 2C, light from a particular portion of an image being focused onto the die (substrate) is, however, focused by all of the lens elements 108 onto the substrate. However, the light from a particular portion of the image is focused onto only one of the photosensitive elements 102. For the remainder of the photosensitive elements 102, the light from that particular portion of the image is focused onto the front surface of the substrate in areas between photosensitive elements 102. It is within the scope of this invention that there may well be circuitry (e.g., image processing circuitry) formed on the front surface of the substrate in the areas between photosensitive elements 102 or in any other appropriate areas. Such circuitry may be adversely affected by light. Hence, these areas between photosensitive elements are preferably "masked" with an opaque layer, such as silicon nitride, aluminum or opaque photoresist (ink).

FIG. 3 shows an arrangement 300 similar to that of FIG. 1. However, in this example, a optically-opaque layer 310 is applied over the substrate 304, and over any circuit elements (not shown) on the surface of the substrate. The layer 310 is formed of any suitable material, such as silicon nitride, opaque photoresist, or the like, and is applied so as to have openings 312 (holes) in registration with the plurality of photosensitive elements 302 on the surface of the substrate. As in FIG. 1C, the array of photosensitive elements may cover only a portion of the surface of the substrate. An optically transmissive layer 306 is applied over the masking layer 310, and can be applied to fill the holes while maintaining a relatively planar surface. The layer 306 can also be chemical-mechanically polished prior to forming lenslets in its exposed surface. Lenslets 308 (preferably diffractive) are formed in the optically transmissive layer. The techniques discussed with respect to FIGS. 1A, 1B, 2A, 2B and 2C are applicable with this arrangement which uses an additional masking layer 310.

In certain applications, it may be desirable to space the lens elements (e.g., 108, 308) further away from the photosensitive elements (e.g., 102,302), while maintaining the integral structure of the substrate, photosensitive elements, masking layer (if used) and lens elements. This will allow greater flexibility in the design of the lenslets, such as increased depth of focus.

Figure 4:
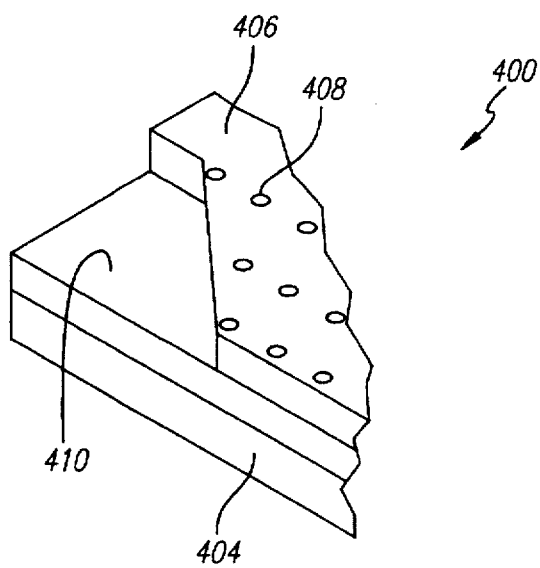
FIG. 4 is a partially cut-away, perspective view of yet another embodiment of the invention.

FIG. 4 shows an arrangement 400 similar to that of FIG. 1. However, in this example, a optically-transmissive layer 410 is applied over the substrate 404, and over any circuit elements (not shown) on the surface of the substrate. The layer 410 is preferably applied with uniform thickness, compensating for topological non-uniformities that may be caused by the underlying photosensitive elements (not shown) on the surface of the substrate. The layer 410 is formed of any suitably optically-transmissive material, such as silicon dioxide (Sio$_2$), spin-on glass, re-flow glass, photoresist, spin-on photoresist, re-flow photoresist or the like, and is preferably of substantially uniform thickness. Spin-on and re-flow techniques provide relatively uniform thickness layers. In the event that the thickness of the layer 410 is non-uniform, as initially applied, it is preferably planarized by chemical-mechanical polishing techniques, or the like. Alternatively, the layer 410 can be applied as a sedimentary layer of relatively uniform thickness, as discussed hereinabove.

Whereas in FIG. 3, the layer 310 acted as a masking layer, to prevent light focused away from a photosensitive element from impacting on circuit elements between photosensitive elements, in this example., the layer 410 acts as a "standoff" to establish a suitable (increased) spacing for the overlying layer 406 containing lenslets 408.

As in FIG. 1C, the array of photosensitive elements in the arrangement 400 may cover only a portion of the surface of the substrate. Further, the techniques discussed with respect to FIGS. 1A, 1B, 2A, 2B and 2C are applicable with the spacing layer 410.

Figure 4A:
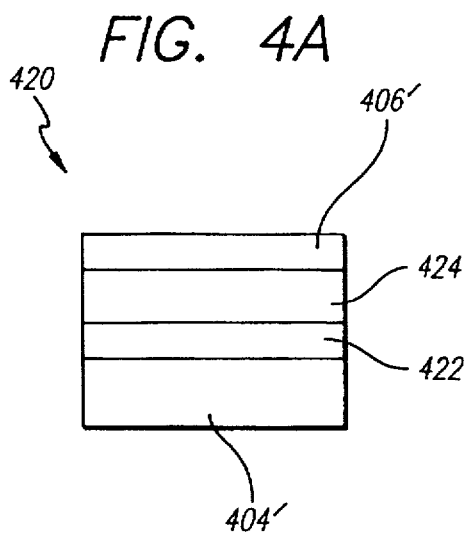
FIG. 4A is a side view of yet another embodiment of the invention.

FIG. 4A shows an arrangement 420 wherein the teachings of FIGS. 3 and 4 are applied in combination. In this example, a masking layer 422 (similar to 310) is applied over the substrate 404', with holes (not shown) aligned with the photosensitive elements (not shown). An optically-transmissive standoff layer 424 (similar to 410) is applied over the masking layer 422. An optically-transmissive layer 406' is applied over the optically-transmissive standoff layer 424, and is provided with lenlets (not shown). The techniques discussed with respect to FIGS. 1A, 1B, 1C, 2A, 2B and 2C are applicable in this arrangement 420.

Figure 4B:
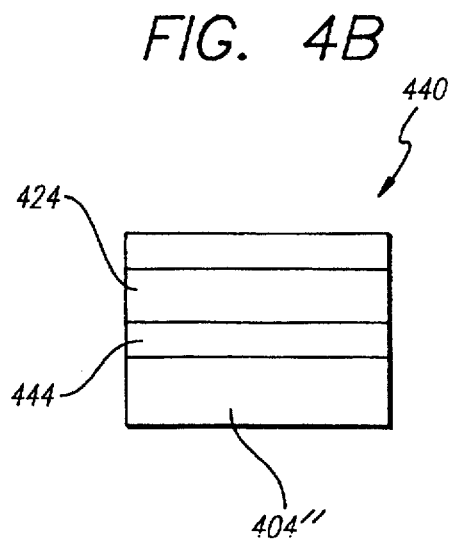
FIG. 4B is a side view of yet another embodiment of the invention.

FIG. 4B shows an arrangement 440 wherein the teachings of FIGS. 3 and 4 are applied in combination. In this example, an optically-transmissive standoff layer 444 (similar to 410) is applied over the substrate 404". An opaque masking layer 442 (similar to 310) is applied over the standoff layer 444, and has holes aligned with the photosensitive elements (not shown). An optically-transmissive layer 406" is applied over the masking layer 442, and is provided with lenlets (not shown). The techniques discussed with respect to FIGS. 1A, 1B, 1C, 2A, 2B and 2C are applicable in this arrangement 420.

Having created a sizeable spacing between the lens elements (e.g., 108, 308, 408) and the photosensitive elements (e.g., 102, 302, 402), alternative and additional arrangements of lens elements can be implemented.

Figure 5:
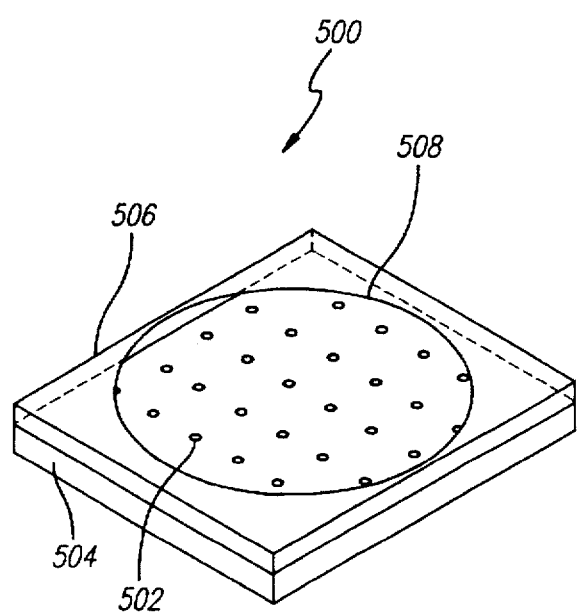
FIG. 5 is a perspective view of yet another embodiment of the invention.

FIG. 5 shows an arrangement 500 wherein a single, large lens element 508 is formed in an optically-transmissive layer 506 overlying an array of photosensitive elements 502 on a substrate 502. Preferably, the lens element 508 is formed as a single binary (diffractive) optical device, covering the entire array of photosensitive elements 502. The techniques discussed with respect to FIGS. 1A, 1B, 1C, 3, 4, 4A and 4B are applicable in this arrangement 500. Preferably, an optically-transmissive layer (not shown) is interposed between the single large lens element 508 and the surface of the substrate 504 (compare the optically-transmissive layer 410 of FIG. 4).

Figure 6:
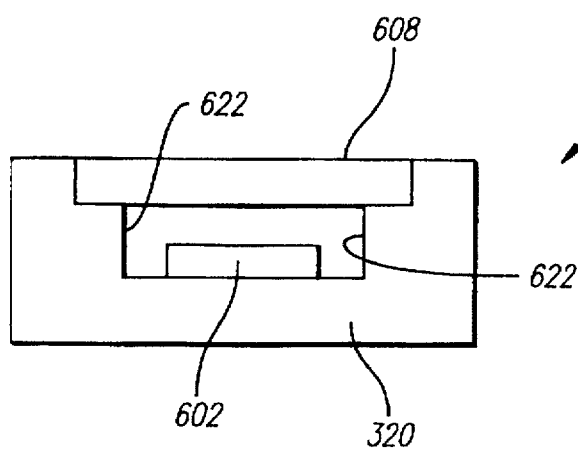
FIG. 6 is a cross-sectional view of yet another embodiment of the invention.

FIG. 6 shows an arrangement 600 where the lens element 608 is not integral with the substrate (as it was in the previous embodiments/arrangements). Rather, in this arrangement, a lens element 608 is mounted to a package 620, or the like, containing the substrate 602 (array of photosensitive elements not shown). The side walls 622 of the package body establish a known standoff for the lens element (i.e., distance between the lens element and the photosensitive array on the surface of the die). The lens element 608 is preferably a refractive optic, similar to those described above (e.g., 108, 308, 408, 508), but in this case is non-integral with the substrate. Further, the techniques discussed with respect to FIGS. 1A, 1B, 1C, 2A, 2B and 2C are applicable in this arrangement 600.

It is within the scope of this invention to provide "mixed" optics comprising a combination of conventional refractive lenses and binary refractive lenses. For example, the lens element 608 can be formed as a conventional refractive lens which is also etched with a diffractive optical pattern.

Figure 7:
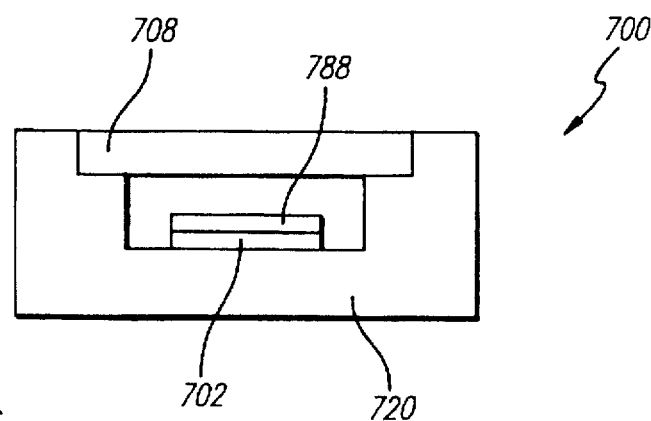
FIG. 7 is a cross-sectional view of yet another embodiment of the invention.

FIG. 7 shows an arrangement 700 similar to that of FIG. 6, in that a lens element 708 is supported above the substrate 702 by a package 720 (similar to 620), or the like. (The photosensitive array on the front surface of the die/substrate is not shown.) However, the substrate is also provided with an integral optic 788 on its front surface. Two variations are possible: (1) the lens element 708 can be a conventional refractive lens, and the substrate-integral optic 788 can be similar to any of the above-described diffractive elements (e.g., 108, 308, 408, 508), or (2) the lens element 708 can be similar to any of the above-described diffractive elements (e.g., 108, 308, 408, 508), and the lens element 788 can be a conventional refracting lens mounted to the surface of the substrate. Further, the techniques discussed with respect to FIGS. 1A, 1B, 1C, 2A, 2B and 2C are applicable in this arrangement 600. In this manner, the "mixed" optics 708 and 788 can be designed to eliminate spherical and/or chromatic aberration. Filters may also be used to remove light having a wavelength subject to chromatic aberration and not otherwise corrected for by the use of "mixed optics".

The preceding arrangements are generally best suited for monochromatic imaging. There also exists a viable requirement for color imaging. Color imaging is typically accomplished with three optical systems, each responsive to a different color of light, such as red (R), green (G) and blue (B). Each system comprises a lens, a filter and an associated photodetector (array). Such triplication of elements is, evidently, costly compared to a single system.

Figure 8:
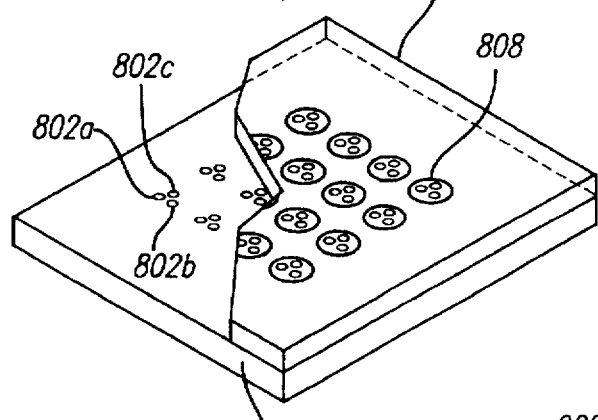
FIG. 8 is a partially cut-away, perspective view of yet another embodiment of the invention.

FIG. 8 shows an arrangement 800 suited for color imaging. An array of photosensitive elements 802 are arranged on the front surface of a substrate 804, in a manner similar to the photosensitive elements 102 (e.g.). However, in this arrangement 800, at each array location, there are three closely-grouped together photosensitive elements ("triplets") 802a, 802b, 802c, rather than a single photosensitive element 102. A 4×4 array is shown, for illustrative clarity. An optically-transmissive layer 406 (similar to 106) is formed over the array of photosensitive element triplets. In this case, there is one lenslet 808 for each "triplet" of photosensitive elements. The lens elements are preferably formed as diffractive elements, and are designed to have different focal points for different wavelengths of light. For example, red (R) light can be focused onto the element 802a of a triplet, green (G) light can be focused onto the element 802b of the triplet, and blue (B) light can be focused onto the element 802c of the triplet. In this manner, color imaging can be achieved. The techniques discussed above, with respect to offsets (so that each triplet represents a pixel of the incident image), masking and transparent layers interposed between the lens element layer (806) and the substrate, supporting the lens structure or another lens structure on a package or the like, providing "mixed" optics, etc., are applicable to the technique of grouping three photosensitive elements at each array (pixel) location.)

Figure 9:
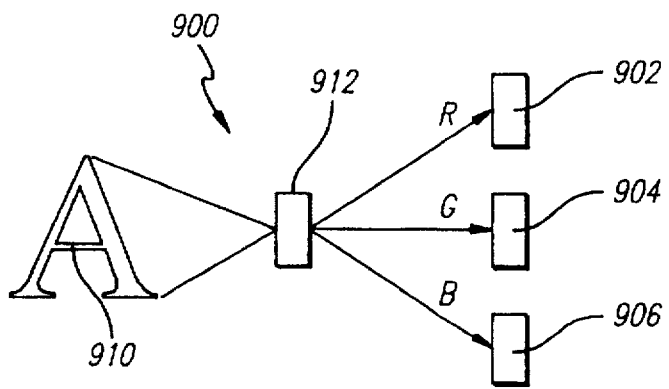
FIG. 9 is a diagrammatic representation of yet another embodiment of the invention.
Figure 9A:
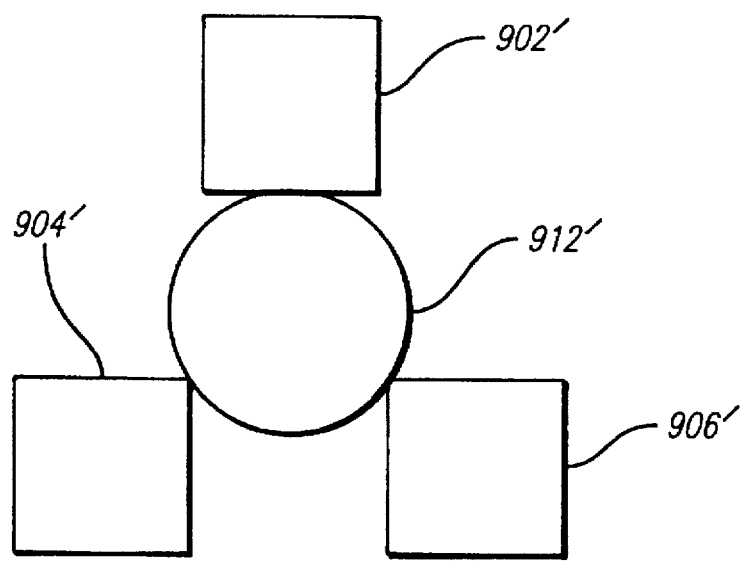
FIG. 9A is a diagrammatic representation of yet another embodiment of the invention.
Figure 9B:
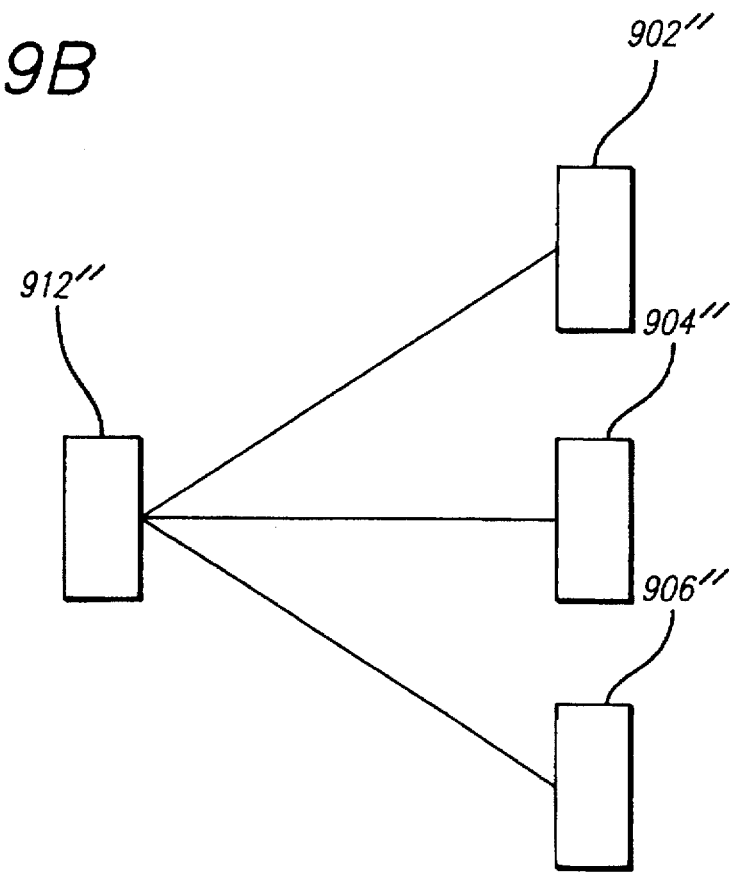
FIG. 9B is a diagrammatic representation of yet another embodiment of the invention.

FIG. 9 shows an alternate arrangement 900 of a color capable solid state image sensor. Whereas the arrangement of FIG. 8 employed a single substrate (die), and triplets of photosensitive elements, in this arrangement 900, three solid-state image sensors 902, 904, 906 are employed, each of which is suited to monochromatic image sensing. Each image sensor 902, 904, 906 is formed in a manner similar to the sensor 100 of FIG. 1 (and the enhancements to the FIG. 1 embodiment, discussed hereinabove, are equally applicable). An image 910 ("A") is focused by any suitable optics (not shown) through a beam splitter 912. The beam splitter 912 is preferably a diffractive optic that is designed to direct different wavelengths of light at different angles. For example, the beam splitter 912 directs red (R) light towards the sensor 902, directs green (G) light towards the sensor 904, and directs blue (B) light towards the sensor 906. The beam splitter 912 can be designed to accommodate a linear, planar arrangement of sensors 902, 904, 906, as shown. Alternatively, the three sensors 902', 904' and 906' can be arranged in a planar, triangular (e.g., equilateral) pattern, as shown in FIG. 9A, so that the angles to each of the sensors from the beam splitter 912' are equal but differently oriented. Alternatively, the three sensors 902", 904", 906" can be arranged in a curved, linear array, as shown in FIG. 9B, so that the distance from the beamsplitter 912" to each of the sensors is the same. The distance can correspond to the focal length (in the usual sense of the term) of the lens. Alternatively, the distance can be sufficient to permit a predetermined mapping of the image onto the sensors. The mapping may be either a one-to-one mapping or may instead be sufficient to be used in combination with a compression or decompression algorithm. The term "focal length" as defined herein for each of the embodiments of the present invention should be construed to include both of these definitions, in addition to the usual meaning of the term "focal length."

The three sensors of any of these embodiments (FIGS. 9, 9A, 9B) can be arranged on any suitable mounting substrate. For example, the three sensors of FIGS. 9A and 9B can be disposed in a package similar to that of FIGS. 6 or 7. For example, the optical element 708 of FIG. 7 could function as a beamsplitter (912), and three sensors, each having its own integral focusing optic could be disposed within the cavity of the package (each in a manner similar to 702/788).

Figure 10:
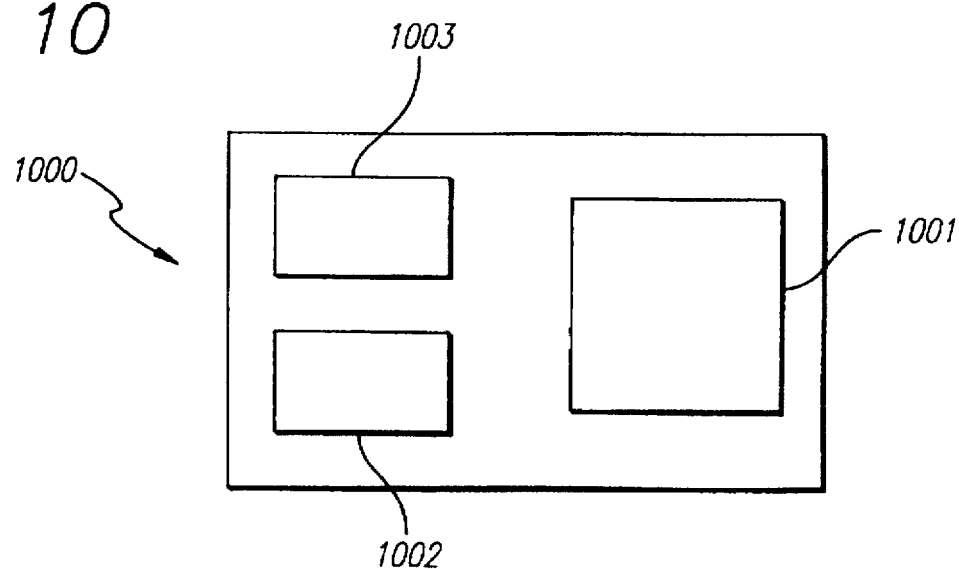
FIG. 10 is a diagrammatic representation of yet another embodiment of the invention.

FIG. 10 shows a chip 1000 comprising an image sensing array 1001. In the preferred embodiment shown in FIG. 10, the chip also includes a logic array 1002 for processing the signals generated by the array 1001. The logic array can be an embedded array as described in, e.g., U.S. patent application Ser. No. 07/596,680. The chip may also include a memory array 1003 for storing signals generated by array 1001 or array 1003. In one embodiment, the memory array 1003 can be a "cache memory."

Figure 11:
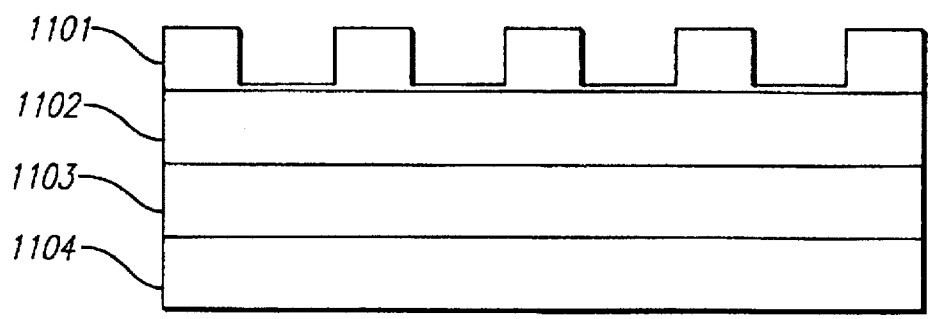
FIG. 11 is a diagrammatic representation of yet another embodiment of the invention.

FIG. 11 shows a cross-sectional view of a method of forming a chip in accordance with an embodiment of the present invention. A substrate 1104 is coated successively with a first optically transmissive layer 1103, such as spun-on glass, a second optically transmissive layer 1102, such as pyrolitic silicon dioxide, and a layer of photoresist 1101. The photoresist 1101 is exposed and developed by conventional techniques. The photoresist 1101 is then used as a mask to etch second optically transmissive layer, 1102. Any suitable etching technique can be used. Preferably, reactive ion etching is used when vertical sidewalls are desired. Wet chemical etching may also be used, alone or in combination with reactive ion etching, to create more rounded geometries where appropriate. In a preferred embodiment, a laser beam is used to improve the shape of the lens, and to correct any defects in the lens shape which may be detected during testing. If desired, the entire lens may be shaped by the use of the laser. This avoids the need for masking and etching, but reduces throughput.

Refractive lenses for use in accordance with the present invention may be produced by any suitable technique. In one embodiment of the present invention, such lenses are shaped by chem-mech polishing.

Figure 12:
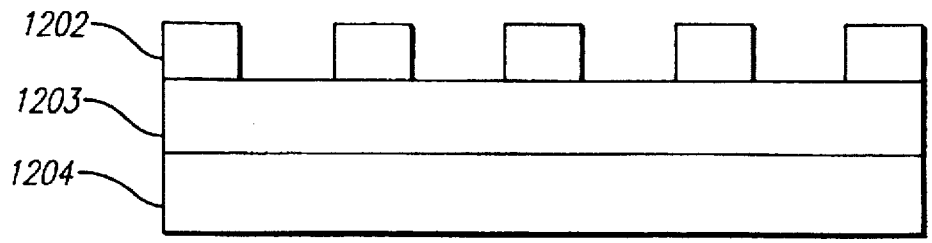
FIG. 12 is a diagrammatic representation of yet another embodiment of the invention.

The result is shown in FIG. 12. In FIG. 12, layer 1202 represents the second optically transmissive layer after the coating and etching step. In this Figure, layer 1202 has been formed into a fresnel or binary lens structure. The first optically transmissive layer 1203 provides a gap between the substrate which permits the lens to focus an image on an appropriate area of the substrate 1204 having one or more image sensing devices.

It is within the purview of one skilled in the art to which the present invention most nearly pertains to implement monochromatic and color image sensors, using diffractive optics, according to the techniques and arrangements set forth above. Certain modifications that may become apparent from study of this disclosure are intended to be within the scope of the present invention. Accordingly, the present invention is not limited to the embodiments disclosed in the instant specification, but is instead defined by the claims and the equivalents thereof.

I claim:

1. A photosensor array, comprising:
   a plurality of lenses for forming a substantially identical light image on laterally spaced areas of a surface respectively; and
   a plurality of photosensors disposed on said surface within said laterally spaced areas for receiving different portions of said light image respectively such that the photosensors in aggregation receive substantially all of said light image.

2. A photosensor array as in claim 1, in which the lenses comprise binary diffractive lens elements.

3. A photosensor array as in claim 1, in which the lenses comprise two-dimensional binary diffractive lens elements.

4. A photosensor array as in claim 1, in which the lenses comprise circular binary diffractive lens elements.

5. A photosensor array as in claim 1, in which each of the photosensors is smaller than said light image.

6. A photosensor array as in claim 1, in which an aggregate area of the photosensors is substantially equal to an area of said light image.

7. A photosensor array as in claim 1, in which:

the photosensors have constant spacings therebetween; and the lenses have spacings therebetween that increase away from a predetermined point in the array.

8. A photosensor array as in claim 7, in which said predetermined point is a center of the array.

9. A photosensor array as in claim 1, in which:

the lenses have constant spacings therebetween; and the photosensors have spacings therebetween that increase away from a predetermined point in the array.

10. A photosensor array as in claim 9, in which said predetermined point is a center of the array.

11. A photosensor array as in claim 1, in which:

the lenses and the photosensors have constant spacings therebetween; and the lenses have focal points with spacings therebetween that increase away from a predetermined point in the array.

12. A photosensor array as in claim 11, in which said predetermined point is a center of the array.

13. A photosensor array, comprising:

a plurality of photosensor units for aggregately sensing a light image, each photosensor unit comprising:

a two-dimensional binary diffractive lens for diffractively forming three substantially identical segments of said light image in three different colors on three rotationally spaced areas of a surface respectively; and three photosensors disposed on said surface at said three rotationally spaced areas for receiving said segments respectively.

14. A photosensor array as in claim 13, in which each lens comprises a circular binary diffractive lens element.

15. A photosensor array as in claim 13, in which said three rotationally spaced areas are substantially equally rotationally spaced from an axis of each lens respectively.

16. A photosensor array as in claim 13, in which said three rotationally spaced areas are substantially equidistant from each lens respectively.

17. A photosensor array as in claim 13, in which said three colors are red, green and blue respectively.

18. A photosensor array as in claim 13, in which each photosensor comprises a two-dimensional array of photosensitive elements.

19. A photosensor array as in claim 13, in which the lenses and the photosensors are arranged such that said light image is constituted by said segments in aggregation.

20. A photosensor array, comprising:

a plurality of photosensor units for aggregately sensing a light image, each photosensor unit comprising:

a multi-dimensional binary diffractive lens for diffractively forming a plurality of substantially identical segments of said light image in a plurality of different colors on a plurality of rotationally spaced areas respectively; and a plurality of photosensors at said plurality of rotationally spaced areas for receiving said segments respectively.

* * * * *